United States Patent [19]
Kuusama

[11] Patent Number: 5,509,081
[45] Date of Patent: Apr. 16, 1996

[54] SOUND REPRODUCTION SYSTEM

[75] Inventor: Juha Kuusama, Tampere, Finland

[73] Assignee: Nokia Technology GmbH, Pforzheim, Germany

[21] Appl. No.: 473,100

[22] Filed: Jun. 7, 1995

Related U.S. Application Data

[63] Continuation of Ser. No. 139,424, Oct. 20, 1993, abandoned.

[30] Foreign Application Priority Data

Oct. 21, 1992 [FI] Finland .................................. 924775

[51] Int. Cl.$^6$ ..................................................... H03G 3/00
[52] U.S. Cl. .............................. 381/103; 381/108; 381/57
[58] Field of Search .................................. 381/108, 107, 381/106, 104, 103, 86, 94, 71, 68.4, 68.2, 57

[56] References Cited

U.S. PATENT DOCUMENTS

| | | | |
|---|---|---|---|
| 3,496,481 | 2/1967 | Torick et al. . | |
| 4,061,874 | 12/1977 | Fricke et al. . | |
| 4,610,024 | 9/1986 | Schulhot | 381/103 |
| 4,628,526 | 12/1986 | Germer | 381/108 |
| 4,630,305 | 12/1986 | Borth et al. | 381/94 |
| 4,641,361 | 2/1987 | Rosback | 381/103 |
| 4,852,175 | 7/1989 | Kates | 381/71 |
| 4,868,881 | 9/1989 | Zwicker et al. | 381/107 |
| 5,077,799 | 12/1991 | Cotton . | |
| 5,081,682 | 1/1992 | Kato et al. . | |
| 5,107,539 | 4/1992 | Kato et al. . | |

FOREIGN PATENT DOCUMENTS

| | | | |
|---|---|---|---|
| 0027519 | 4/1981 | European Pat. Off. . | |
| 0026929 | 4/1981 | European Pat. Off. . | |
| 0163545 | 12/1985 | European Pat. Off. . | |
| 61-108212 | 5/1986 | Japan . | |
| 2207313 | 1/1989 | United Kingdom | 381/107 |

Primary Examiner—Curtis Kuntz
Assistant Examiner—Ping W. Lee
Attorney, Agent, or Firm—Ware, Fressola, Van Der Sluys & Adolphson

[57] ABSTRACT

The invention relates to a sound reproduction system comprising a source of a sound signal in electrical form, a first filter group for dividing the signal derived from the sound signal source into several sound signals occurring in different frequency bands and an adjustable gain amplifier for each frequency band for amplifying the sound signal occurring in said frequency band. To take into account the noise existing in the environment of the sound reproduction system in the adjustment of the system, the system further comprises means for generating an electrical signal proportional to the background noise existing in the environment and means for adjusting the gain of the amplifiers in response to said electrical signal proportional to the background noise.

8 Claims, 2 Drawing Sheets

SOUND REPRODUCTION SYSTEM

This is a continuation of application Ser. No. 08/139,424 filed on Oct. 20, 1993, now abandoned.

TECHNICAL FIELD

The present invention relates to a sound reproduction system comprising a source of a sound signal in electrical form and an adjustable gain amplifier for amplifying said sound signal.

BACKGROUND OF THE INVENTION

A system of this type is, e.g., described in EP 0027519 as an on-vehicle automatic loudness control apparatus. This system contains a microphone producing an output signal representative for the combined wanted signal level from the loudspeaker and the unwanted noise from motor, tires, wind, etc. present in the passenger space of a car. The system further contains a summing circuit adding the modified (squared) signals from the audio input and the microphone, one of which with reverse polarity. It is the object of the described system to provide automatic volume control depending on the level of disturbing noise. The system described in the above-mentioned EP 0027519 works independently from the frequency or frequency range of the wanted audio signal or the unwanted noise.

Another similar system is described in U.S. Pat. No. 5,077,799. This system contains a microphone producing a signal representative for only the ambient noise level. The microphone output signal is used to generate a control voltage for a variable resistance device. The control voltage circuit has different time constant elements for controlling volume up or down. Also, this circuit does not work depending on the frequency or frequency range of a wanted input signal or the ambient noise signal.

A further similar system is described in DE 4021969, which can be explained as a refinement of the solution as described in EP 0027519, before summing microphone and audio signal are filtered and two different signal paths are provided, one for the (normal) wanted audio signal and a parallel one for an effect sound derived from the wanted audio signal.

Also, this system works independently from the input audio frequency or frequency range and the ambient noise frequency or range.

DISCLOSURE OF INVENTION

The present invention makes use of the insight that it is not necessary to increase the audio level over the whole audio frequency range when the unwanted noise signal level increases at a certain frequency or frequency range if the wanted audio signal at this moment contains a signal in the same frequency range strong enough to mask this unwanted noise.

The object of the present invention is to provide a sound reproduction system capable of taking into account changes in the background noise and divide the wanted audio signal frequency range into several bands, each reacting independently from each other on the noise detected in the listener space.

Conventionally, such sound reproduction systems comprise a source of a sound signal in electrical form, a first filter group for dividing the signal derived from the sound signal source into several sound signals occurring in different frequency bands and an adjustable gain amplifier for each frequency band for amplifying the sound signal occurring in said frequency band. To achieve background noise correction in accordance with the invention, such a sound reproduction system is characterized in that it further comprises at least one microphone for generating an electrical signal proportional to the total sound existing in the environment of the sound reproduction system, another filter group for dividing the total sound signal obtained from the microphone into several band signals occurring in different frequency bands corresponding to the frequency bands of the first filter group, means for each frequency band for determining the band sound level signals corresponding to the band signals of the total sound signal which exist in said bands and means for each frequency band for subtracting the electrical signal representing the sound level generated by the amplifier of each frequency band from the band sound level signal occurring in the respective frequency band for generating signals proportional to the level of background noise existing in the different frequency bands, and means for each frequency band for adjusting its amplifier gain in response to a signal proportional to the level of background noise existing in said frequency band.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
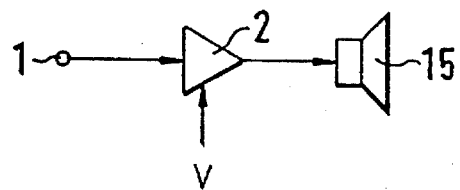
FIG. 1 illustrates a sound reproduction system of the prior art.

FIG. 1 shows a conventional sound reproduction system comprising a source 1 of a sound signal in electrical form and an amplifier 2 amplifying the signal derived from said source. The gain of the amplifier 2 is adjusted by means of signal V. The sound is reproduced by loudspeaker 15. The sound signal source 1 may be any conventional sound source, such as a tuner, a tape recorder or a CD player.

Figure 2:
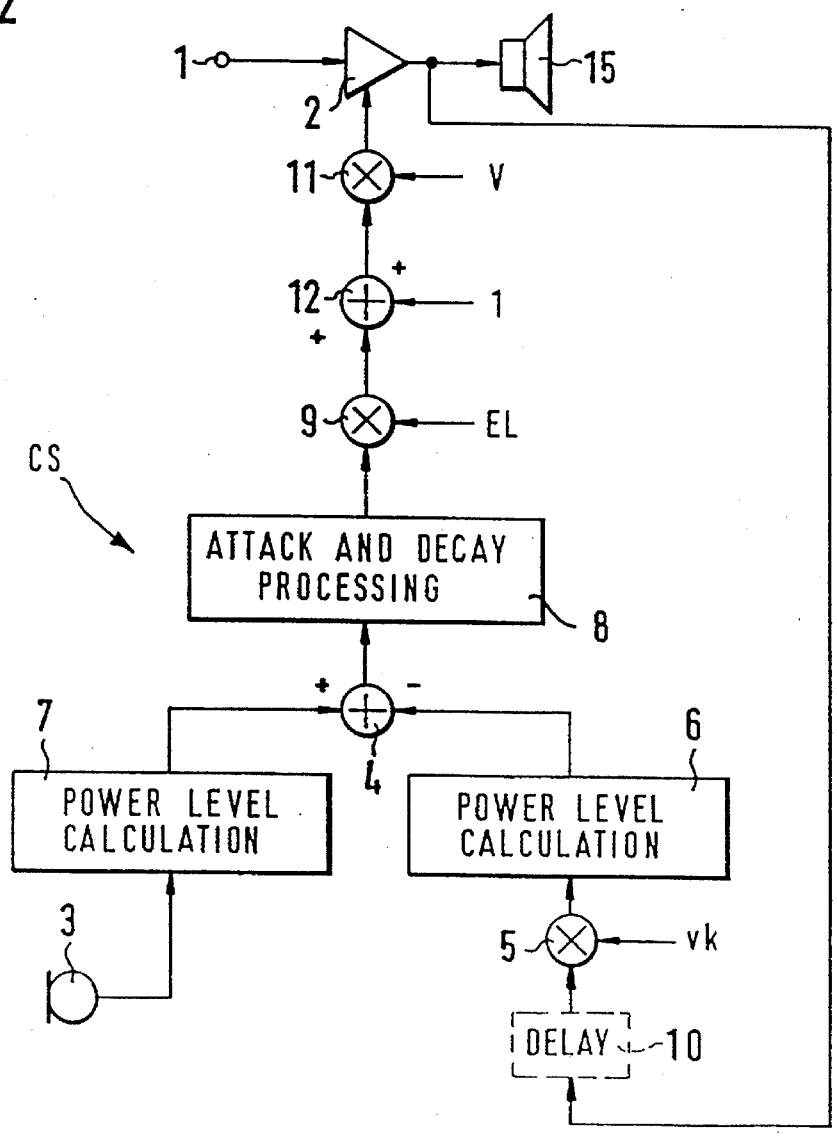
FIG. 2 shows an exemplary circuit for a sound reproduction system, according to the invention, for one of the sound signal bands.

FIG. 2 shows a schematic circuit diagram for one channel of a sound reproduction system of the invention. It differs from the system of FIG. 1, in that in addition to the amplifying signal V, another signal is applied by way of a multiplier 11, said another signal correcting the gain of the amplifier 2 in such a way that the gain will be set in accordance with the noise level existing in the environment of the sound reproduction system. In FIG. 2, the system effecting the correction is indicated with the reference CS. An essential part of this correction system CS is a microphone 3 which is mounted in the interior of the car and thus generates a signal proportional to the total sound existing in the listening space. In the circuit of FIG. 2, this signal generated by the microphone 3 is processed in block 7, which computes the level of the sound from the microphone 3, i.e., produces the total sound level signal. To generate a signal proportional to the level of the music coming from the loudspeaker 15 of the sound reproduction system, the system comprises blocks 10, 5 and 6, the input of block 10 being connected to the output of the amplifier 2. Block 10 is a time-delay means delaying the electrical signal for a delay time corresponding to the travel time of sound from loudspeaker 15 to microphone 3. Thus the signals from the microphone and the time-delay unit 10 are simultaneous.

After the unit 10, the signal is applied to a multiplier 5 wherein it is multiplied by a gain correction constant vk to achieve a suitable signal level. This gain correction vk is largely dependent on the sensitivity level of the microphone 3. From the multiplier 5, the signal is supplied to block 6 wherein a power level corresponding to the signal is calculated. The power levels obtained from blocks 6 and 7 are subtracted from one another in a summing unit 4, an electrical signal proportional to the background noise level being obtained from the output of the summing unit.

The useful signal, i.e., the signal generated by the sound reproduction system, has thus already been subtracted from said electrical signal. This noise level signal is applied to block 8, wherein it is processed to eliminate changes that are too abrupt from the signal. By such processing, the occurrence of changes that are too abrupt in the gain of the amplifier 2 are prevented. The attack and decay processing of block 8 provides different time constants for reducing the gain of amplifier 2 (attack) and increasing the gain (decay). The operation is similar to an automatic level control for audio recorders; however, in the case of audio recorders, the aim is to provide a signal level for recording just below the maximum signal level at which distortion begins and still not change the dynamic of the program in such a way that this becomes annoying. So, in case of audio recording, the attack time is a few milliseconds and the decay time is about one or two minutes. Attack and decay times for the present application are quite different, because there is no danger of clipping (distortion), and the aim is always to provide sufficient difference between wanted audio signal (e.g., music) and unwanted noise signal. So, both time constants are about a few hundred milliseconds.

From block 8, the signal proportional to the noise level may be supplied to multiplier 9, wherein it is multiplied by an Effect Level signal (EL), which is a correction intensity level signal and makes it possible to adjust the signal level so that the signal proportional to the noise level can influence the amplifier 2 in the desired ratio. This control signal determines how aggressively the system compensates for the noise inside the car. There is no exact value, as the value is dependent upon the particular application.

From multiplier 9, the signal is applied to a summing unit 12 wherein the value 1 is added thereto. Thereafter the signal is applied to multiplier 11, wherein it is multiplied by the normal amplification signal V of the amplifier. The purpose of the summing unit 12 is to produce a situation wherein the output of the multiplier 11 comprises two factors, one of these being proportional to the gain V only, and the other being proportional to the noise level signal multiplied by the gain V and the signal EL. In this way, when the noise level is very low or close to zero, a signal proportional to the gain V only is obtained for the amplifier 2. If, on the other hand, the background noise intensifies and thereby the value of the noise level signal increases, this term including the noise level signal will become increasingly dominant in the control input signal of the amplifier 2. In this way, a gain level for the amplifier 2 that is proportional to the noise existing in the environment of the sound reproduction system is obtained. This may be expressed as follows:

gain of block $2 = V[1 + EL(P_{car} - P_{audio})]$.

As can be seen by this expression, EL determines the effect of the noise on the gain of the block 2, in other words, the aggressiveness of the control. V can be the conventional volume control.

Figure 3:
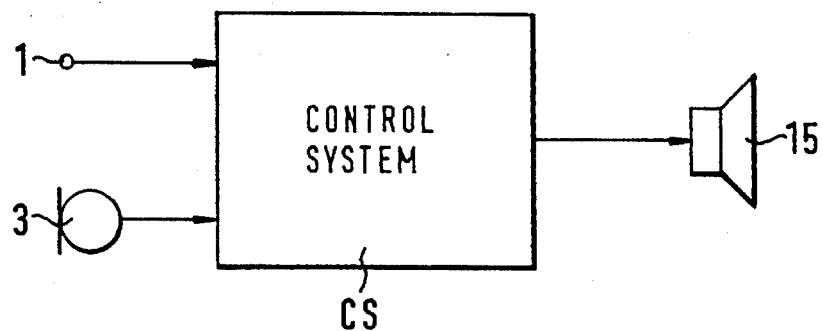
FIG. 3 is a block diagram of a sound reproduction system, according to the invention, such as shown in FIG. 2.

FIG. 3 shows a block diagram of the system of FIG. 2, the system CS of FIG. 2 being shown as a single box having as inputs the electrical signal derived from the sound signal source 1 and the electrical signal derived form the microphone 3. The output is constituted by the signal to the loudspeaker 15.

Figure 4:
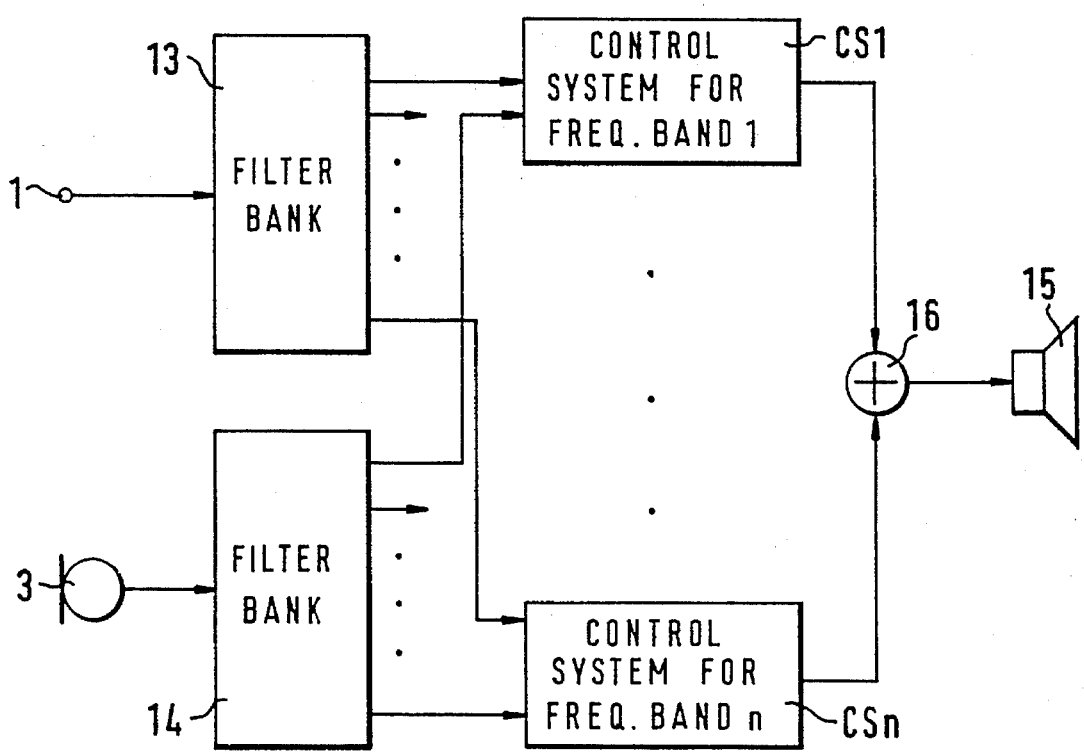
FIG. 4 is a block diagram of a sound reproduction system, according to the invention.

FIG. 4 shows a sound reproduction system according to the invention. In this system, one control system CS is assigned for each band of the equalizer, said control system CS thus corresponding to the control system shown in FIG. 2. In the circuit of FIG. 4, these control systems are indicated with reference numerals CS1, ..., CSn and are n in number. The system of FIG. 4 further comprises a source 1 of an electrical sound signal, but now the signal is applied to a filter group 13 prior to being applied to the amplifier, and the filter group divides it into several sound signals occurring in different frequency bands, said sound signals being respectively applied to the different control systems CS1, ..., CSn. Correspondingly, the signal from the microphone 3 is similarly divided to the same frequency bands by means of filter group 14. The outputs from these filters are again applied to a control system CS1, ..., CSn representing the respective frequency band. Hereby it is possible to combine the sound signal existing in each frequency band and the noise occurring in said frequency band so as to enable adjustment of the gain of said frequency band in such a way that the noise occurring in said frequency band can be compensated. The outputs of the control systems CS1, ..., CSn are combined in a summing unit 16, supplying the loudspeaker 15. As stated previously, the control systems CS1, ..., CSn comprise exactly the same units as the control system CS illustrated in FIG. 2. Thus these control systems comprise means for determining a band sound level signal corresponding to the total sound signal occurring in said frequency band (which is obtained from the filter group 14). They further comprise means for subtracting an electrical signal representing the sound level generated by the amplifier of the pertinent frequency band from the band sound level signal occurring in said frequency band, to provide an electrical signal proportional to the level of background noise occurring in said frequency band. The control systems further comprise means for adjusting the gain of the amplifier of said frequency band, so that the background noise occurring in said frequency band is taken into account in the adjustment of the amplifier.

In the foregoing, the sound reproduction system of the invention has been described only by means of one exemplary circuit diagram, and it is to be understood that particularly the circuit shown in FIG. 2 may be modified in a variety of ways without departing from the scope defined by the appended claims.

Similarly, although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A sound reproduction system, comprising:

a source (1) of a sound signal in electrical form;

a first filter group (13) for dividing the signal derived from the sound signal source (1) into several electrical sound signals, each electrical sound signal occurring in different frequency bands;

an adjustable gain amplifier for each frequency band for amplifying the electrical sound signal occurring in said frequency band and for providing an electrical sound level signal representing a sound level for each frequency band;

first power level calculation means for each frequency band responsive to said electrical sound level signal for providing a first power level signal ($P_{audio}$) indicative of the power level corresponding to the electrical sound level signal for each frequency band;

at least one microphone (3) for generating an electrical total sound signal proportional to the total sound existing in the environment of the sound reproduction system;

another filter group (14) for dividing said electrical total sound signal into several band signals occurring in frequency bands corresponding to the frequency bands of the first filter group (13);

second power level calculation means for each frequency band for determining a second power level signal ($P_{car}$) indicative of the power level corresponding to the band signal for each frequency band;

subtraction means for each frequency band for subtracting the first power level signal from the second power level signal occurring in the respective frequency band for generating error signals proportional to the level of background noise existing in the different frequency bands; and adjustment means for each frequency band for adjusting its amplifier gain in response to a signal proportional to a desired gain value (V) and in response to a signal proportional to the product of said desired gain value and a scaled error signal, said adjustment means for each frequency band including first multiplication means for providing said scaled error signal as the product of said error signal for each frequency band and a gain adjustment signal (EL), the magnitude of said gain adjustment signal (EL) being selected to modify the magnitude of said error signal such that said scaled error signal for each frequency band adjusts the amplifier gain for each frequency band.

2. A sound reproduction system according to claim 1, further comprising:

means for combining the electrical sound level signals for each frequency band for generating an output signal; and at least one loudspeaker responsive to said output signal for producing sound.

3. A sound reproduction system according to claim 2, further comprising time-delay means for each frequency band for delaying each of the electrical sound level signals for each frequency band prior to being provided to said first power level calculation means for a delay time corresponding to the travel time of sound from said loudspeaker to said microphone.

4. A sound reproduction system according to claim 1, further comprising processing means for each frequency band for eliminating abrupt changes in said error signal prior to being provided to said adjustment means.

5. A sound reproduction system according to claim 1, wherein said adjustment means for each frequency band adjusts said amplifier gain (G) for each adjustable gain amplifier in each frequency band in accordance with the following relationship:

$$G=V\{1+EL(P_{car}-P_{audio})\}$$

6. A sound reproduction system according to claim 5, further comprising:

means for combining the electrical sound level signals for each frequency band for generating an output signal; and at least one loudspeaker responsive to said output signal for producing sound.

7. A sound reproduction system according to claim 6, further comprising time-delay means for each frequency band for delaying each of the electrical sound level signals for each frequency band prior to being provided to said first power level calculation means for a delay time corresponding to the travel time of sound from said loudspeaker to said microphone.

8. A sound reproduction system according to claim 7, further comprising processing means for each frequency band for eliminating abrupt changes in said error signal prior to being provided to said adjustment means.

* * * * *

UNITED STATES PATENT AND TRADEMARK OFFICE
CERTIFICATE OF CORRECTION

PATENT NO. : 5,509,081
DATED : April 16, 1996
INVENTOR(S) : Kuusama

It is certified that error appears in the above-indentified patent and that said Letters Patent is hereby corrected as shown below:

Column 5, claim 1, line 33, insert --multiplication--
before "product".

Signed and Sealed this

Twentieth Day of August, 1996

Attest:

BRUCE LEHMAN

Attesting Officer    Commissioner of Patents and Trademarks